(12) United States Patent
Kim

(10) Patent No.: US 8,405,151 B2
(45) Date of Patent: Mar. 26, 2013

(54) PROTECTION CIRCUIT FOR SEMICONDUCTOR DEVICE

(75) Inventor: Jong-Su Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 251 days.

(21) Appl. No.: 12/832,348

(22) Filed: Jul. 8, 2010

(65) Prior Publication Data

US 2011/0291194 A1 Dec. 1, 2011

(30) Foreign Application Priority Data

May 28, 2010 (KR) .................... 10-2010-0050458

(51) Int. Cl.
*H01L 23/58* (2006.01)

(52) U.S. Cl. ................ 257/355; 257/E23.141

(58) Field of Classification Search .............. 257/355, 257/E23.141
See application file for complete search history.

(56) References Cited

U.S. PATENT DOCUMENTS

| 6,078,487 | A | * | 6/2000 | Partovi et al. ............ 361/56 |
| 7,098,694 | B2 | * | 8/2006 | Bhattacharya et al. ...... 326/81 |
| 2004/0188776 | A1 | * | 9/2004 | Russ et al. ............... 257/401 |
| 2005/0205928 | A1 | * | 9/2005 | Kwon et al. .............. 257/345 |

FOREIGN PATENT DOCUMENTS

KR 1019990048682 7/1999
KR 1020050106924 11/2005

OTHER PUBLICATIONS

Notice of Allowance issued from Korean Intellectual Property Office on Aug. 31, 2011.

* cited by examiner

*Primary Examiner* — Thao P. Le
(74) *Attorney, Agent, or Firm* — IP & T Group LLP

(57) ABSTRACT

A protection circuit for a semiconductor device includes a first gate electrode formed on a substrate of a first conductivity type, and a source and a drain of a second conductivity type having an opposite polarity to the first conductivity type. The source and the drain are commonly coupled to a ground voltage terminal, and the first gate electrode is coupled to a power supply voltage terminal.

22 Claims, 3 Drawing Sheets

PROTECTION CIRCUIT FOR SEMICONDUCTOR DEVICE

CROSS-REFERENCE TO RELATED APPLICATIONS

The present application claims priority of Korean Patent Application No. 10-2010-0050458, filed on May 28, 2010, which is incorporated herein by reference in its entirety.

BACKGROUND OF THE INVENTION

Exemplary embodiments of the present invention relate to a protection circuit for a semiconductor device, and more particularly, to a protection circuit for preventing an electrical effect of charges caused by plasma induced damage occurring during a fabrication process of a MOS transistor.

The reliability of semiconductor devices is influenced by fabrication processes of the semiconductor devices. In particular, processes using plasma charges have a greater influence on the reliability of semiconductor devices.

In recent fabrication processes of semiconductor devices, a plasma process is used more often in order to form a plurality of metal layers. Hence, during the plasma process, gate electrode oxide layers and metal interconnections of the semiconductor devices may be severely damaged by plasma charges.

Specifically, charges generated during the plasma process are accumulated in a P-type well of a substrate. When bias power is applied to the P-type well, the charges accumulated in the P-type well are discharged through metal interconnections at the same time. Therefore, the metal interconnections may be melted or the gate electrode oxide layers may be damaged.

To address those concerns, a conventional semiconductor device further includes a protection diode which is capable of discharging charges accumulated in a P-type well.

FIG. 1 is a circuit diagram illustrating a conventional protection circuit and a conventional semiconductor device.

Referring to FIG. 1, a diode is provided as an example of a protection circuit 100, and an inverter is provided as an example of a semiconductor device 200.

The semiconductor device 200 includes a PMOS transistor PM1 and an NMOS transistor NM1 each having a source, a drain, and a gate electrode.

In the configuration of the semiconductor device 200, a power supply voltage VDD is applied to the source of the PMOS transistor PM1, and a ground voltage VSS is applied to the source of the NMOS transistor NM1. The gate electrode of the PMOS transistor PM1 and the gate electrode of the NMOS transistor NM1 are commonly coupled to an input terminal IN, and the drain of the PMOS transistor PM1 and the drain of the NMOS transistor NM1 are commonly coupled to an output terminal OUT, thereby constituting an inverter. Thus, the inverter inverts a signal inputted through the input terminal IN and outputs the inverted signal through the output terminal OUT.

The diode included in the protection circuit 100 is coupled between the input terminal IN and the semiconductor device 200. When charges are accumulated in a P-type well P-WELL and generate a voltage level greater than a threshold voltage level of the diode (for example, approximately 0.7 V), the diode discharges the accumulated charges through the input terminal IN.

FIG. 2 is a cross-sectional view illustrating the configuration of the protection circuit 100 and the semiconductor device 200 of FIG. 1.

The semiconductor device 200 includes the PMOS transistor PM1 and the NMOS transistor NM1, and the protection circuit 100 includes the diode.

The NMOS transistor NM1 includes a gate electrode oxide layer 20, a gate electrode 30, spacers 40A and 40B, a source 50A, and a drain 50B. The gate electrode oxide layer 20 is formed on a P-type well P-WELL which is formed by doping P-type impurities into a silicon substrate. The gate electrode 30 is formed on the gate electrode oxide layer 20. The spacers 40A and 40B are formed on both sidewalls of the gate electrode 30. The source 50A and the drain 50B are formed by doping N-type impurities into the P-type well P-WELL.

The PMOS transistor PM1 includes a gate electrode oxide layer 60, a gate electrode 70, spacers 80A and SOB, a drain 90A, and a source 90B. The gate electrode oxide layer 60 is formed on an N-type well N-WELL which is formed by doping N-type impurities into the silicon substrate. The gate electrode 70 is formed on the gate electrode oxide layer 60. The spacers 80A and 80B are formed on both sidewalls of the gate electrode 70. The drain 90A and the source 90B are formed by doping P-type impurities into the N-type well N-WELL.

The diode is formed by doping N-type impurities into the P-type well P-WELL between the PMOS transistor PM1 and the NMOS transistor NM1.

At this time, the gate electrode 30 of the NMOS transistor NM1, the gate electrode 70 of the PMOS transistor PM1, and the diode are coupled to the input terminal IN through a metal interconnection.

When the potential of the charges accumulated in the P-type well P-WELL is higher than that of the threshold voltage level (approximately 0.7 V), the diode discharges the accumulated charges through the input terminal IN, thereby protecting the semiconductor device.

However, since an amount of charges which can be discharged to the input terminal IN by the diode is limited, a plurality of diodes is required in order to serve as the protection circuit. This may cause difficulties in the fabrication processes and the circuit design of the semiconductor device. Furthermore, since a plurality of diodes is to be disposed in the protection circuit, a circuit area for the protection circuit increases. Thus, the protection circuit including a plurality of diodes may be seen as inefficient in view of the design of the semiconductor device.

SUMMARY OF THE INVENTION

Exemplary embodiments of the present invention are directed to a protection circuit for a semiconductor device, which is capable of preventing an electrical effect of charges caused by plasma induced damage, thereby improving the reliability of the semiconductor device.

Exemplary embodiments of the present invention are also directed to a protection circuit for a semiconductor device, which is capable of protecting a metal interconnection from being melted when charges accumulated in a substrate are discharged.

Further, exemplary embodiments of the present invention are directed to a protection circuit for a semiconductor device, which is capable of increasing a discharge amount of charges, thereby simplifying fabrication processes of the semiconductor device and reducing the area necessary for effective implementation of the semiconductor device.

In accordance with an exemplary embodiment of the present invention, a protection circuit for a semiconductor device includes a first gate electrode formed on a substrate of a first conductivity type, and a source and a drain of a second conductivity type having an opposite polarity to the first conductivity type, wherein the source and the drain are commonly coupled to a ground voltage terminal, and the first gate electrode is coupled to a power supply voltage terminal.

In accordance with another exemplary embodiment of the present invention, a protection circuit for a semiconductor device includes an NMOS transistor, comprising a first gate electrode, a source, and a drain, disposed on a P-type substrate, a first discharge path coupling the source of the NMOS transistor to a ground voltage terminal, a second discharge path coupling the drain of the NMOS transistor to the ground voltage terminal, a first P-type doped region spaced apart from the NMOS transistor and disposed on the P-type substrate, a third discharge path coupling the first P-type doped region to the ground voltage terminal, a second gate electrode disposed on the P-type substrate, and a second P-type doped region coupled to the second gate electrode.

In accordance with yet another exemplary embodiment of the present invention, a protection circuit for a semiconductor device includes a charge discharging unit coupled to a ground voltage terminal, and configured to discharge charges accumulated in a substrate of the semiconductor device to the ground voltage terminal, and a buffer unit coupled between an input terminal of the semiconductor device and the charge discharging unit and configured to buffer the charges accumulated in the substrate.

DESCRIPTION OF SPECIFIC EMBODIMENTS

Figure 1:
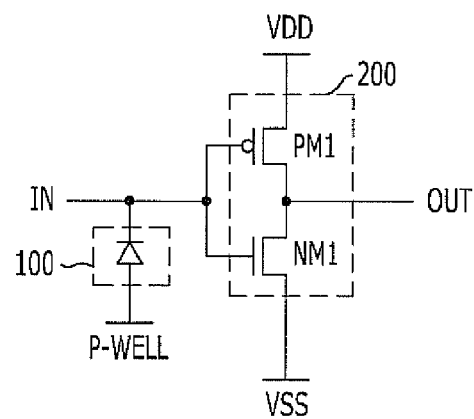
FIG. 1 is a circuit diagram illustrating a conventional protection circuit and a conventional semiconductor device.
Figure 2:
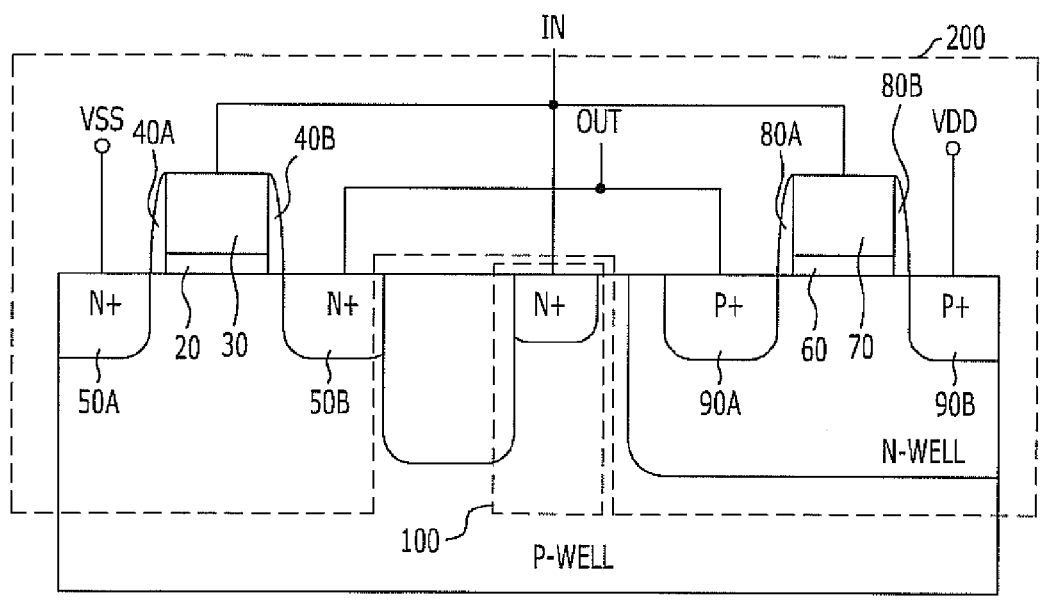
FIG. 2 is a cross-sectional view illustrating patterns of the protection circuit and the semiconductor device of FIG. 1.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate, but also a case where a third layer exists between the first layer and the second layer or the substrate.

Figure 3:
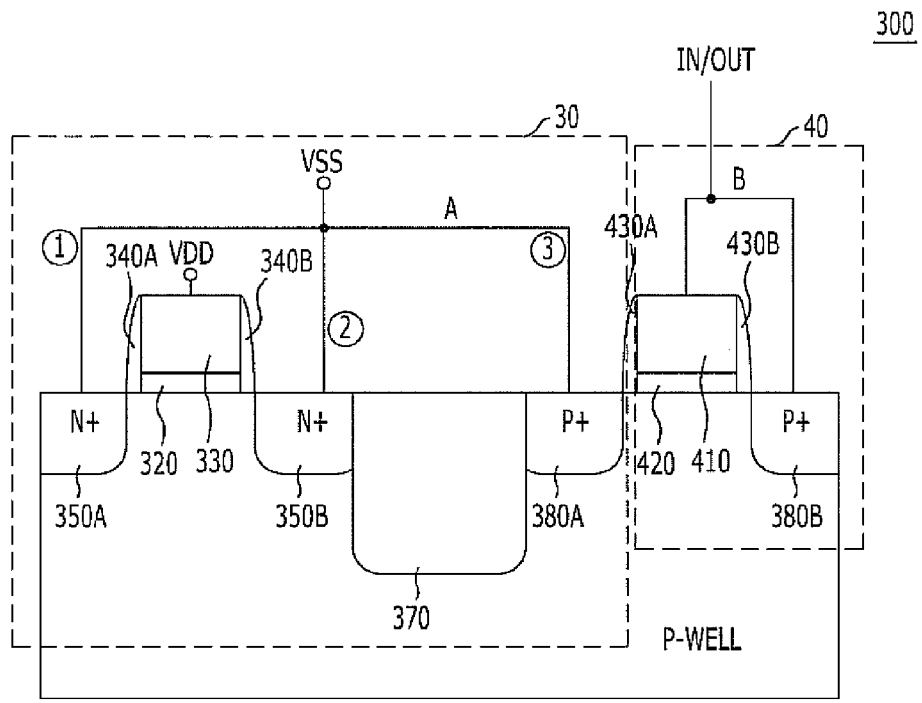
FIG. 3 is a cross-sectional view illustrating patterns of a protection circuit in accordance with an exemplary embodiment of the present invention.

FIG. 3 is a cross-sectional view illustrating a protection circuit 300 in accordance with an embodiment of the present invention.

Referring to FIG. 3, the protection circuit 300, in accordance with an exemplary embodiment of the present invention, includes a charge discharging unit 30 and a buffer unit 40.

The charge discharging unit 30 includes an NMOS transistor NM2, a first doped region 380A, an isolation layer 370, and a first metal interconnection A.

The NMOS transistor NM2 includes a gate electrode oxide layer 320, a gate electrode 330, spacers 340A and 340B, a source 350A, and a drain 350B. The gate electrode oxide layer 320 is formed on a P-type well P-WELL which is formed by doping P-type impurities into a silicon substrate. The gate electrode 330 is formed on the gate electrode oxide layer 320. The spacers 340A and 340B are formed on both sidewalls of the gate electrode 330. The source 350A and the drain 350B are formed by doping N-type impurities into the P-type well P-WELL.

The gate electrode 330 of the NMOS transistor NM2 is coupled to a power supply voltage (VDD) terminal, and the source 350A and the drain 350B of the NMOS transistor NM2 are coupled to a ground voltage (VSS) terminal by the first metal interconnection A.

In this embodiment, a charge discharging path through which the source 350A and the ground voltage (VSS) terminal are coupled by the first metal interconnection A is referred to as a "first discharge path ①", and a charge discharging path through which the drain 350B and the ground voltage (VSS) terminal are coupled by the first metal interconnection A is referred to as a "second discharge path ②" Also, a charge discharging path through which the first doped region 380A and the ground voltage (VSS) terminal are coupled by the first metal interconnection A is referred to as a "third discharge path ③"

The first P-type doped region 380A is coupled to the ground voltage (VSS) terminal by the first metal interconnection A and is electrically separated from the drain 350B of the NMOS transistor NM2 by the isolation layer 370.

When the power supply voltage VDD is supplied to the gate electrode 330 of the NMOS transistor NM2 and the ground voltage VSS is supplied to the source 350A and the drain 350B of the NMOS transistor NM2, the NMOS transistor NM2 is turned on so that charges accumulated in the P-type well P-WELL are discharged through the first discharge path ① and the second discharge path ② to the ground voltage (VSS) terminal whose potential level approaches negative infinity.

As such, due to the charge discharging unit provided in the protection circuit 300 in accordance with the embodiment of the present invention, the charges accumulated in the P-type well P-WELL are discharged through the first discharge path ① and the second discharge path ② to the ground voltage (VSS) terminal whose potential level approaches negative infinity. Hence, a large amount of charges can be discharged to improve the reliability of the semiconductor device.

Furthermore, since the protection circuit 300 discharges a large amount of charges at one time, the conventional protection circuit, including a plurality of diodes with a limited discharge amount, can be replaced, thereby simplifying the fabrication process of the semiconductor device and reducing the area necessary for effective implementation of the semiconductor device.

However, where a large amount of electrons are simultaneously discharged through the first metal interconnection A to the ground voltage (VSS) terminal in a short period of time, the first metal interconnection A may be melted by overcurrent flowing therethrough. To address this concern, the protection circuit 300 in accordance with an exemplary embodiment of the present invention further includes a buffer unit 40.

The buffer unit 40 includes a PMOS transistor PM2 which includes a gate electrode oxide layer 420, a gate electrode 410, spacers 430A and 430B, and a second doped region 380B. The gate electrode oxide layer 420 is formed on a P-type well P-WELL which is formed by doping P-type impurities into the silicon substrate. The gate electrode 410 is formed on the gate electrode oxide layer 420. The spacers 430A and 430B are formed on both sidewalls of the gate electrode 410. The second doped region 380B is formed by doping P-type impurities into the P-type well P-WELL. The second P-type doped region 380B and the gate electrode 410 are coupled by a second metal interconnection B.

The gate electrode 410 of the PMOS transistor PM2 buffers charges accumulated in the P-type well P-WELL of the substrate until the charges generate a threshold voltage (Vth). Since the charges accumulated in the P-type well P-WELL are accumulated in the gate electrode 410 through the second P-type doped region 380B and the second metal interconnection B, the gate electrode 430 serves as a buffer.

When an amount of charges buffered by the gate electrode 410 of the PMOS transistor PM2 generates a potential voltage that exceeds the threshold voltage (Vth), the PMOS transistor PM2 is turned on so that the exceeded charges are again discharged to the P-type well P-WELL.

At this time, when the PMOS transistor PM2 is turned on, the charge discharging unit 30 discharges the charges accumulated in the P-type well P-WELL to the ground voltage (VSS) terminal through the first discharge path ①, the second discharge path ②, and the third discharge path ③.

As such, due to the buffer unit 40 provided in the protection circuit 300, an amount of charges discharged through the first metal interconnection A to the ground voltage (VSS) terminal is buffered to prevent overcurrent from flowing through the first metal interconnection A. Consequently, the melting of the first metal interconnection A may be prevented.

Figure 4A:
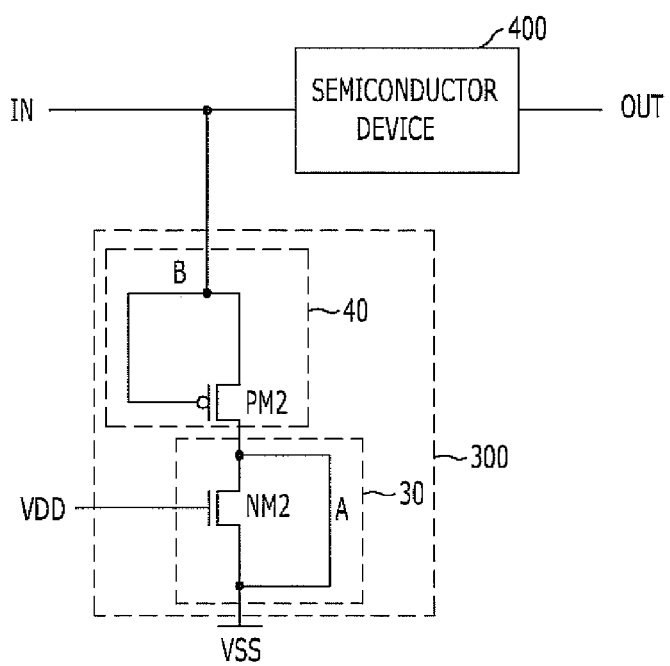
FIG. 4A is a circuit diagram illustrating a protection circuit and a semiconductor device in accordance with an exemplary embodiment of the present invention.

FIG. 4A is a circuit diagram illustrating the protection circuit 300 and a semiconductor device 400 in accordance with an exemplary embodiment of the present invention.

Specifically, FIG. 4A illustrates the protection circuit 300 equivalent to the protection circuit 300 illustrated in FIG. 3.

The protection circuit 300 in accordance with an exemplary embodiment of the present invention includes the charge discharging unit 30 and the buffer unit 40.

The charge discharging unit 30 includes the NMOS transistor NM2 and the first metal interconnection A, and the buffer unit 40 includes the PMOS transistor PM2 which is diode-connected by the second metal interconnection B. Although the buffer unit 40 illustrated in FIG. 4A is implemented with the PMOS transistor PM2 which is diode-connected by the second metal interconnection B, the present invention is not limited thereto. The buffer unit 40 may be implemented with a MOS capacitor or a diode.

As illustrated in FIG. 4A, the charge discharging unit 30 may include the NMOS transistor NM2 having the source and the drain coupled to the ground voltage (VSS) terminal by the first metal interconnection A. Furthermore, the buffer unit 40 may include the PMOS transistor PM2 having the source and the gate electrode diode-connected by the second metal interconnection B.

When the ground voltage VSS is supplied to the source of the NMOS transistor NM2 and the power supply voltage VDD is supplied to the gate electrode of the NMOS transistor NM2, the potentials at the source and the drain of the NMOS transistor NM2 become the potential of the ground voltage VSS. That is, the charges accumulated in the drain and the source of the NMOS transistor NM2 are discharged to the ground voltage (VSS) terminal whose potential level approaches negative infinity.

The PMOS transistor PM2 maintains a turned-off state until charges are accumulated at the diode-connected gate electrode and source to generate a potential level equal to the threshold voltage level (Vth).

When the potential of the charges accumulated in the diode-connected gate electrode and source exceed the threshold voltage (Vth), the PMOS transistor PM2 is turned on.

When the PMOS transistor PM2 is turned on, the charges accumulated in the source of the PMOS transistor PM2 are discharged through the first metal interconnection A to the ground voltage (VSS) terminal.

In the protection circuit 300, the charges generated during the plasma process and accumulated in the substrate are discharged to the ground voltage (VSS) terminal. Thus, an amount of charges that can be discharged can be increased to approach infinity.

Figure 4B:
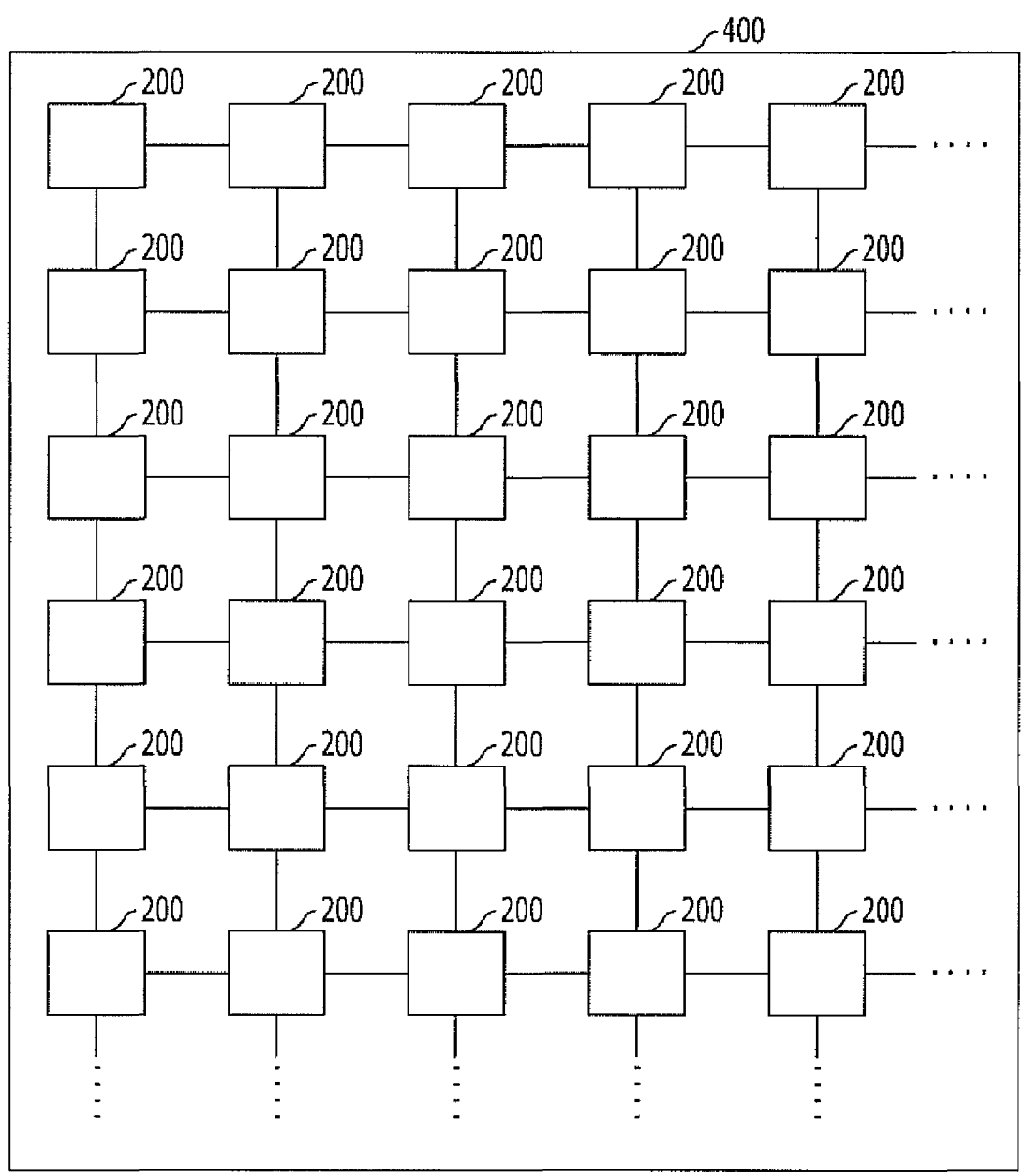
FIG. 4B is a conceptual diagram of the semiconductor device illustrated in FIG. 4A.

In the prior art, a protection circuit 100 is provided to each semiconductor device 200 (i.e., there is a one-to-one correspondence between the number of protection circuits 100 and the number of semiconductor devices 200) because the discharge amount of the protection circuit 100 is small. However, since the discharge amount of the protection circuit 300 may approach infinity, the protection circuit 300 can protect a semiconductor device 400 including a large number of semiconductor units 200 as illustrated in FIG. 4B. Thus, the fabrication process of the semiconductor device can be simplified and the design area necessary for effective implementation of the semiconductor device can be reduced.

The protection circuit in accordance with the exemplary embodiments of the present invention discharges charges generated by the plasma process performed in a multilayer metal interconnection process, thereby improving the reliability of the semiconductor device.

In addition, the protection circuit in accordance with the exemplary embodiments of the present invention discharges charges, which are generated by the plasma process performed in a multilayer metal interconnection process, through the metal interconnection to prevent the damage of the gate electrode oxide layer of the semiconductor device.

Furthermore, the protection circuit in accordance with the exemplary embodiments of the present invention further includes the buffer circuit which adjusts an amount of charges discharged through the metal interconnection to prevent the melting of the metal interconnection.

Moreover, the protection circuit in accordance with the exemplary embodiments of the present invention discharges charges, which are generated by the plasma process, to the ground voltage terminal to increase a discharge amount of charges. Consequently, the fabrication process of the semiconductor device can be simplified, and the design area necessary to effectively implement the semiconductor device can be reduced.

While the present invention has been described with respect to the specific embodiments, it will be apparent to those skilled in the art that various changes and modifications may be made without departing from the spirit and scope of the invention as defined in the following claims.

What is claimed is:

1. A protection circuit for a semiconductor device, comprising:
   a first gate electrode formed on a substrate of a first conductivity type; and
   a source and a drain of a second conductivity type having an opposite polarity to the first conductivity type, wherein the source and the drain are commonly coupled to a ground voltage terminal, and the first gate electrode is coupled to a power supply voltage terminal.

2. The protection circuit of claim 1, wherein the source and the drain are commonly coupled to the ground voltage terminal by a first metal interconnection.

3. The protection circuit of claim 2, further comprising:
a first doped region of the first conductivity type which is coupled to the ground voltage terminal by the first metal interconnection.

4. The protection circuit of claim 3, further comprising:
a second gate electrode formed on the substrate of the first conductivity type; and
a second doped region of the first conductivity type which is connected to the second gate electrode by a second metal interconnection.

5. The protection circuit of claim 3, wherein the first doped region is separated from the drain or source by an isolation layer.

6. The protection circuit of claim 2, wherein charges accumulated in the substrate of the first conductivity type are discharged to the ground voltage terminal through the first metal interconnection commonly coupled to the source and the drain, when a ground voltage is supplied to the source and the drain.

7. The protection circuit of claim 4, wherein the second gate electrode receives charges accumulated in the substrate of the first conductivity type through the second doped region, and buffers the received charges until the received charges generate a potential voltage equal to a threshold voltage.

8. The protection circuit of claim 7, wherein the second gate electrode is turned on when the received charges generate a potential voltage equal to or greater than the threshold voltage.

9. The protection circuit of claim 8, wherein the charges accumulated in the substrate are discharged to the ground voltage terminal through the first metal interconnection commonly coupled to the source, the drain, and the first doped region, when the second gate electrode is turned on.

10. The protection circuit of claim 1, wherein the first conductivity type is a P-type polarity, and the second conductivity type is an N-type polarity.

11. A protection circuit for a semiconductor device, comprising:
an NMOS transistor, comprising a first gate electrode, a source, and a drain, disposed on a P-type substrate, wherein the first gate electrode is coupled to a power supply voltage terminal;
a first discharge path coupling the source of the NMOS transistor to a ground voltage terminal;
a second discharge path coupling the drain of the NMOS transistor to the ground voltage terminal;
a first P-type doped region spaced apart from the NMOS transistor and disposed on the P-type substrate;
a third discharge path coupling the first P-type doped region to the ground voltage terminal;
a second gate electrode disposed on the P-type substrate; and
a second P-type doped region coupled to the second gate electrode.

12. The protection circuit of claim 11, wherein, when a ground voltage is supplied to the source and drain of the NMOS transistor, charges accumulated in the substrate are discharged to the ground voltage terminal through the first discharge path and the second discharge path.

13. The protection circuit of claim 11, wherein the second gate electrode receives charges accumulated in the substrate through the second P-type doped region and buffers the received charges until the received charges generate a potential voltage equal to a threshold voltage.

14. The protection circuit of claim 13, wherein the second gate electrode is turned on when the received charges generate a potential voltage equal to or greater than the threshold voltage.

15. The protection circuit of claim 14, wherein, when the ground voltage is supplied to the source and drain of the NMOS transistor and the second gate electrode is turned on, the charges accumulated in the substrate are discharged to the ground voltage terminal through the first discharge path, the second discharge path, and the third discharge path.

16. A protection circuit for a semiconductor device, comprising:
a charge discharging unit coupled to a ground voltage terminal, and configured to discharge charges accumulated in a substrate of the semiconductor device to the ground voltage terminal; and
a buffer unit coupled between an input terminal of the semiconductor device and the charge discharging unit and configured to buffer the charges accumulated in the substrate, wherein the charge discharging unit comprises a first transistor having a first source and a first drain coupled to the ground voltage terminal by a first metal interconnection, and a first gate electrode coupled a power supply voltage terminal.

17. The protection circuit of claim 16, wherein the charge discharging unit discharges charges of the first drain of the first transistor to the ground voltage terminal when a ground voltage is supplied to the first source and the first drain of the first transistor.

18. The protection circuit of claim 16, wherein the buffer unit comprises a second transistor having a second drain coupled to the ground voltage terminal by the first metal interconnection, and a second source and a second gate electrode diode-connected together by a second metal interconnection.

19. The protection circuit of claim 16 wherein the buffer unit comprises a MOS transistor having a second drain coupled to the ground voltage terminal by the first metal interconnection, and a second source and a second gate electrode diode-connected together by a second metal interconnection.

20. The protection circuit of claim 18, wherein the buffer unit buffers charges of the second source of the second transistor until the charges generate a potential voltage equal to a threshold voltage of the second gate electrode.

21. The protection circuit of claim 18, wherein, when the charges accumulated in the second gate electrode of the second transistor generate a potential voltage equal to or greater than the threshold voltage, the second transistor is turned on to discharge charges of the second drain of the second transistor to the ground voltage terminal.

22. The protection circuit of claim 19, wherein, when the charges accumulated in the second gate electrode of the MOS transistor generate a potential voltage equal to or greater than a threshold voltage of the second gate electrode, the MOS transistor is turned on to discharge charges of the second drain of the MOS transistor to the ground voltage terminal.

* * * * *